United States Patent [19]
Gleim

[11] Patent Number: 5,850,128
[45] Date of Patent: *Dec. 15, 1998

[54] POWER AMPLIFIER FOR AN INDUCTIVE LOAD

[75] Inventor: Gunter Gleim, Villingen, Germany

[73] Assignee: Deutsche Thomson-Brandt GmbH, Villingen-Schwenningen, Germany

[*] Notice: This patent issued on a continued prosecution application filed under 37 CFR 1.53(d), and is subject to the twenty year patent term provisions of 35 U.S.C. 154(a)(2).

[21] Appl. No.: 747,916

[22] Filed: Nov. 12, 1996

[30] Foreign Application Priority Data

Nov. 29, 1995 [DE] Germany ................... 195 44 368.3

[51] Int. Cl.$^6$ ............................. G09G 1/04; H01J 29/70
[52] U.S. Cl. ............................. 315/395; 315/408
[58] Field of Search ................... 315/397, 396, 315/395, 387, 403, 408; 348/745, 807; 330/265

[56] References Cited

U.S. PATENT DOCUMENTS

| | | | |
|---|---|---|---|
| 3,488,551 | 1/1970 | Bryden | 315/395 |
| 4,484,150 | 11/1984 | Carver | 330/297 |
| 4,961,032 | 10/1990 | Rodriguez-Cavazos | 315/397 |

FOREIGN PATENT DOCUMENTS

| | | | |
|---|---|---|---|
| 0660508A1 | 6/1995 | European Pat. Off. | H03F 1/02 |
| 2227396 | 7/1990 | United Kingdom | H03F 7/02 |

*Primary Examiner*—Gregory C. Issing
*Attorney, Agent, or Firm*—Joseph S. Tripoli; Joseph J. Laks; Daniel E. Sragow

[57] ABSTRACT

Power amplifier circuit for an inductive load including a supply voltage applied to the inductive load via a series circuit comprising a first transistor electronically coupled to a second transistor for conducting current from the supply voltage through the first and second transistors to the inductive load, wherein a reference potential smaller than the supply voltage is coupled at a center point of the series circuit. A circuit network is electronically coupled at a first node to a base of the first transistor and at a second node to a control voltage, the control voltage being greater than the supply voltage, wherein, when a voltage induced in the inductive load resulting from a change in current through the inductive load reaches a threshold level, the control voltage is fed via the circuit network to the base of said first transistor to block current flow between the first and second transistors to cause the second transistor to be electronically disconnected from the supply voltage and to be electronically connected to the reference potential, whereby the second transistor remains conducting while permitting the voltage at the inductive load to be greater than the supply voltage.

6 Claims, 2 Drawing Sheets

POWER AMPLIFIER FOR AN INDUCTIVE LOAD

FIELD OF THE INVENTION

The invention is related to a power amplifier for an inductive load which reduces power dissipation.

BACKGROUND OF THE INVENTION

A power amplifier for an inductive load is used, for example, for generating correction currents which are fed to the convergence correction coils in a television projection system. A correction current of this type has an analog profile, for example sawtooth, parabolic, cosinusoidal or similar waveform, and as a rule is different from line to line.

In particular, correction currents of this type often have great current changes in each case at the beginning of a television line, it being the case, for example, that the current which has previously risen with a sawtooth waveform falls to zero again in a relatively short time at the beginning of a line. Such a great current change inevitably brings about a great voltage change at the inductive load. Such voltage changes, which may also have the form of pulses or voltage spikes, generally effect an appreciable power loss at the amplifier.

SUMMARY OF THE INVENTION

The invention is based on the object of designing an amplifier of this type in a simple manner such that the power loss at the amplifier is reduced. This object is achieved by means of the invention specified in the indesendent claims. Advantageous developments of the invention are specified in the subclaims.

The invention consequently consists in the fact that a network at the base of the first transistor is connected to a second operating voltage which is greater than the first operating voltage, in such a way that the amplitude of the output voltage at the load can be greater than the first operating voltage.

The reduction in the power loss is achieved, in particular, by two circuit or rating features.

An essential advantage of the invention consists in the fact that the output voltage at the load can assume significantly higher values than the first operating voltage which feeds the output stage. At first, this appears implicitly to be impossible, because then the output transistors are switched on and clamp, in other words to a certain extent clip, the output voltage to the first operating voltage. The advantageous effect whereby the output voltage can exceed the value of the first operating voltage is achieved by virtue of the fact that a second operating voltage which is greater than the first operating voltage is applied to the network in the base circuit of the first transistor. This second operating voltage then ensures that the first output stage transistor receives, at its base, a voltage which is approximately equal to the maximum amplitude of the output voltage at the load. This prevents the output voltage at the load from being clamped to the first operating voltage and clipped at this voltage. Although it is true that a second operating voltage is then required which is greater than the first operating voltage, this second operating voltage, however, passes only to the low-power network in the base circuit of the output stage transistor and effects only a small power loss. The first operating voltage, which supplies the actual power for the output stage, at the same time retains its lower value appreciably below the maximum amplitude of the output voltage.

The centre point of the series circuit formed by the two output stage transistors is preferably connected to a reference potential, which is appreciably smaller than the first operating voltage, via a diode which is forward biased for the voltage sections brought about by current changes. The diode is preferably connected to earth. The following advantageous effect is achieved thereby. In the event of a great current change in the inductive load, a voltage section having a great change is unavoidably produced at the load. In the event of a current drop, this voltage section has negative polarity. During this voltage section, the current initially continues to flow with the same polarity as before the beginning of the current drop. In order that this current can flow, a voltage driving the current must be present. In the case of known circuits, the amplifier remains connected to the operating voltage during this time, as a result of which an appreciable power loss is produced. The invention is now based on the insight that solely the induced voltage at the inductive load suffices as driving voltage for the said period of time during the great current change in the inductive load. This means that the amplifier is completely disconnected from the operating voltage during this time and thus no power is drawn from the power supply unit. Nevertheless, the current in the inductive load retains its desired profile. The operating voltage during the negative or positive voltage section on account of the current change does not, therefore, need to be made available from the power supply unit, but rather is formed by the induced voltage at the inductive load on account of the current change itself.

If the diode is connected to a third operating voltage, which is appreciably smaller than the first operating voltage, instead of to earth, the amplifier operates via the diode with the smaller, third operating voltage in the event of a small signal amplitude at the load, and via the first transistor with the first operating voltage in the event of a large signal amplitude.

BRIEF DESCRIPTION OF THE DRAWINGS

The invention is explained below, with reference to the drawing, using an example with concrete voltage details. When considering the voltages, the base/emitter forward voltage of the transistors of approximately 0.7 V is ignored in each case. In the drawing.

DETAILED DESCRIPTION OF INVENTION

Figure 1:
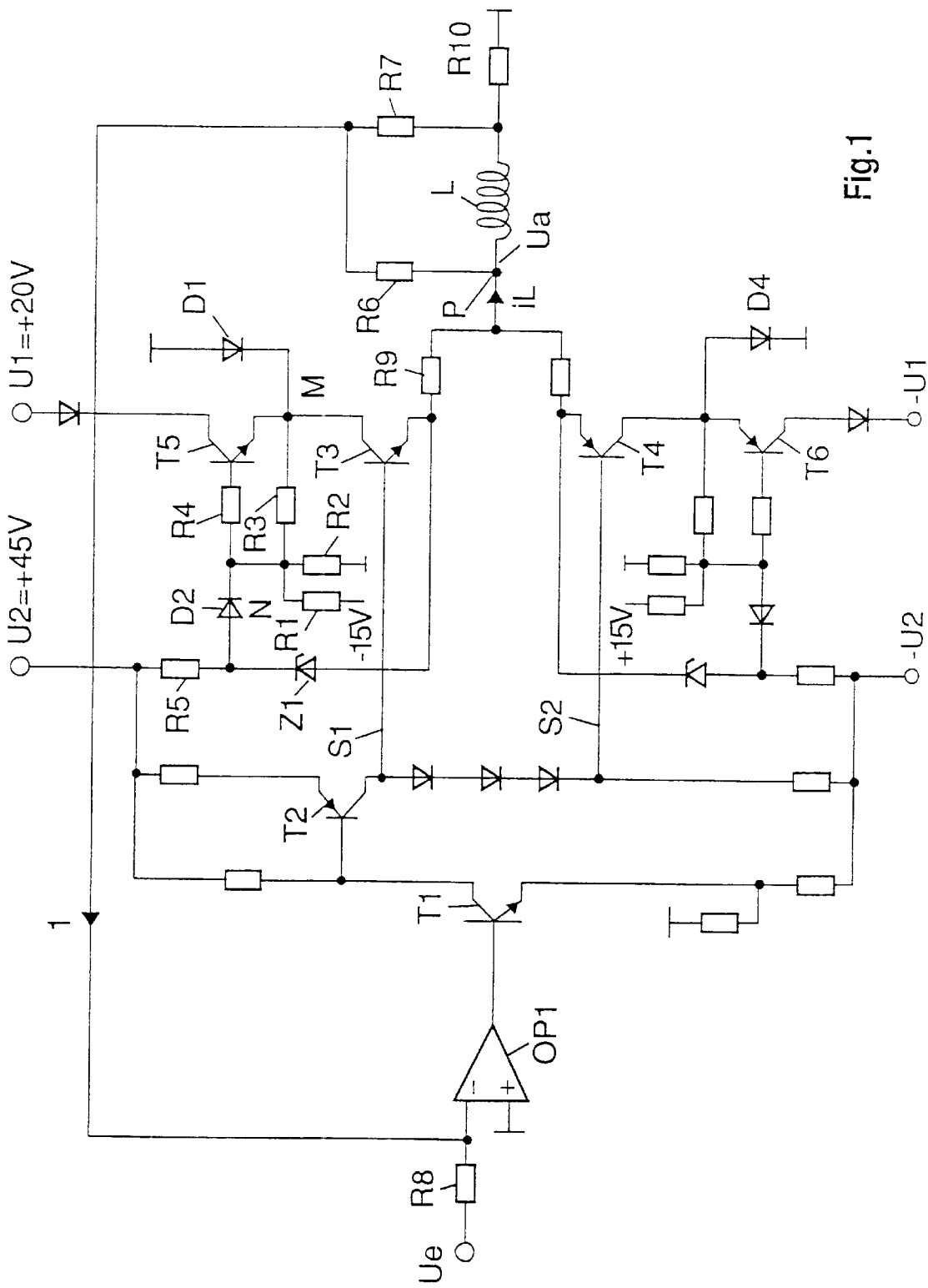
FIG. 1 shows an exemplary embodiment of an amplifier according to the invention.

In FIG. 1, the input voltage Ue passes via the resistor R8 and via the operational amplifier OP1 to the input of the driver circuit having the transistors T1, T2. The voltage passes from the output of the driver circuit T1, T2 via the line S1 to the base of the output stage transistor T3, which is connected via the transistor T5 to the first operating voltage U1 of +20 V. A second operating voltage U2 of +45 V serves as operating voltage for the driver stage T1, T2 and additionally feeds the network N having the diode D2 and the resistors R1, R2, R3, R4 in the base circuit of the transistor T5. The emitter of the transistor T3 is connected via a low-value protective resistor R9 of approximately 1 ohm to an inductive load in the form of the coil L, the other end of which is earthed via the current measuring resistor R10. The emitter of T3 is additionally connected to the network N via the zener diode Z1 which serves as a threshold value element. A feedback path having the resistors R6, R7 and the line 1 is provided between the output and the input of the circuit. This section of the circuit acts for positive currents iL with the illustrated direction through the coil L. The lower section of the circuit having the transistors T4, T6 is complementary and its structure is identical to the upper section. It operates for currents iL of opposite polarity and is therefore not described separately below.

Figure 2:
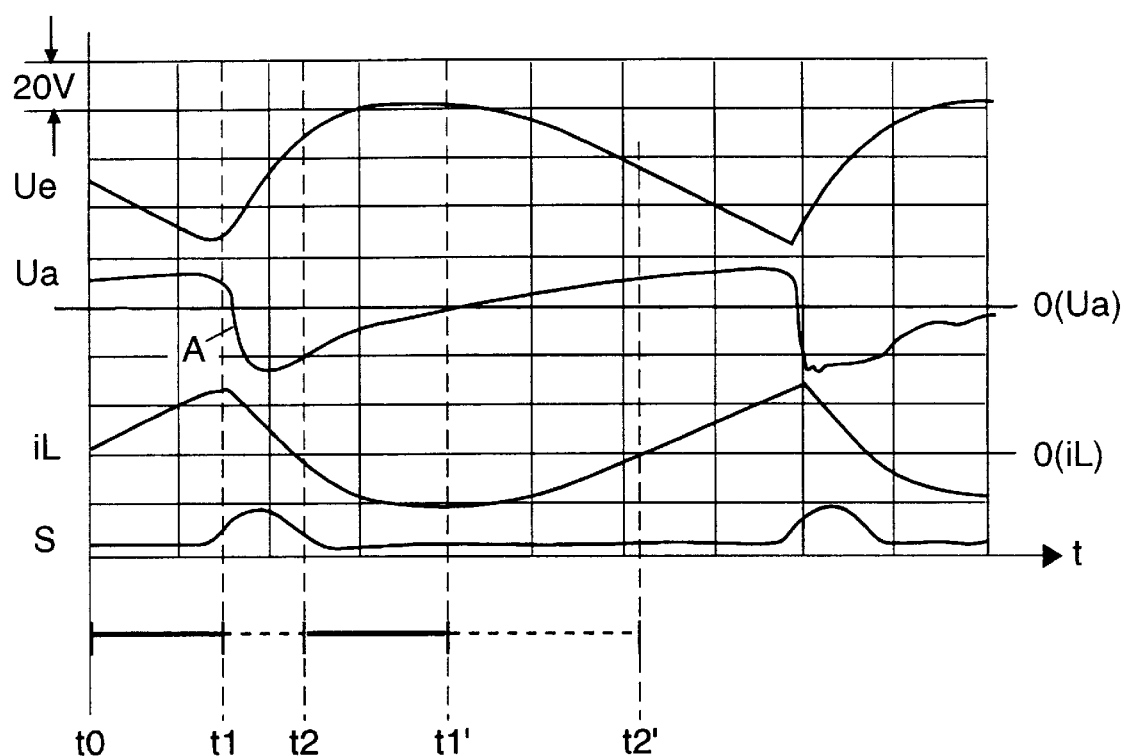
FIG. 2 shows curves for elucidating the method of operation of the amplifier according to FIG. 1.

The method of operation of this circuit is explained below with reference to FIG. 2. The upper curve in FIG. 2 shows the input voltage Ue. From t0–t1, this input voltage Ue effects a current iL, rising approximately with a sawtooth waveform, through the coil L. During this time, the output stage transistors T5, T3 are both in the on state. The current between t0 and t1 thus flows from the operating voltage terminal for U1 via T5, T3, R9, L and R10. Between t0 and t1, the output stage having the output stage transistors T5 and T3 is thus connected to the operating voltage U1. Power is therefore drawn from the power supply during this time.

At the instant t1, which represents, for example, the end of a line defined by the sync pulses S, a great drop in the current iL begins on account of the profile of Ue. On account of the inductance of the coil L at the point P, this current drop brings about a negative voltage section A in the output voltage Ua down to approximately −30 volts. As a result of the feedback via the line 1, the transistor T1 is negative at its base, and therefore the collector of the transistor 2 is negative as well. As a result, the base of T3 and the emitter of T3 also become negative. The falling current iL from t1–t2 flows further via the transistor T3 in the on state. However, the falling current iL no longer comes from the operating voltage U1, but rather via the diode D1 which has now been switched on by the negative voltage section A and is connected to earth. The centre point M is thus virtually connected to earth. The transistor T5 is in this case blocked by the zener diode Z1 and the network N. The operating voltage U1 of +20 volts is therefore disconnected from the output stage, with the result that no current and no power are drawn from the power supply during this time. The circuit therefore operates from t1–t2 with an operating voltage generated within itself, namely with the induced voltage produced by the current change of iL in the coil L.

The output voltage Ua at the coil L can exceed the value of the operating voltage U1 of +20 volts and is not clamped or clipped to U1 by the transistor T5. This is achieved by virtue of the fact that the higher second operating voltage of U2=+45 volts is applied to the base of T5 and ensures that T5 is blocked. The output voltage of Ua can therefore assume values of approximately up to +45 volts, although the single operating voltage U1 supplying the output stage with power is only 20 volts.

In the period t2–t1', power is drawn from the power supply again. Since the current iL is now negative, however, this current flows from the negative operating voltage −U1. The same advantages once again apply for the period t1'–t2' as for the period t1–t2. This means that in this period, too, the operating voltage −U1 is disconnected, the diode D4 is in the on state and no power is drawn from the power supply unit. After the period has elapsed, the instant t2' then once again corresponds to the instant t0. The periods t1–t2 and t1'–t2' thus represent those times during which the advantages described and the reduction in the power loss are achieved.

The diode D1 does not necessarily have to be connected to earth. As is illustrated by dashed lines as an option in FIG. 1, the diode D1 can also be connected to a voltage U3, which is appreciably smaller than U1, for example a voltage of +10 V. The circuit then operates as follows: as long as the voltage Ua is in the range from 0–10 V, the current flows from the terminal for U3 via the diode D1 and the transistor T3, while T5 is blocked as a result of appropriate rating of the network N. If the voltage Ua exceeds the value of +10 V, the transistor T5 is switched on via the zener diode Z1 and the network N and the diode D1 is blocked between the point M and +10 V. The output stage then operates with the operating voltage U1.

I claim:

1. Power amplifier circuit for an inductive load including:

a supply voltage applied to said inductive load via a series circuit comprising a first transistor electronically coupled to a second transistor for conducting current from said supply voltage through said first and second transistors to said inductive load, wherein a center point of said series circuit is coupled to ground;

a circuit network electronically coupled at a first node to a base of said first transistor and at a second node to a control voltage, said control voltage being greater than said supply voltage;

wherein, when a voltage induced in said inductive load resulting from a change in current through said inductive load reaches a threshold level, said control voltage is fed via said circuit network to the base of said first transistor to block current flow between said first and second transistors to cause said second transistor to be electronically disconnected from said supply voltage and to be electronically connected to ground, whereby said second transistor remains conducting while permitting said voltage at said inductive load to be greater than said supply voltage.

2. Amplifier circuit according to claim 1, wherein the control voltage additionally serves as operating voltage for a driver stage connected upstream of the amplifier.

3. Amplifier circuit according to claim 1, wherein said center point M of said series circuit is coupled to ground via a forward biased diode D1.

4. Amplifier circuit according to claim 1, wherein said inductive load comprises a coil.

5. Amplifier circuit according to claim 4, wherein said second transistor T3 is electronically coupled to ground via a diode D1 for a voltage signal less than said threshold value indicative of a small signal amplitude at said coil, and wherein said second transistor T3 is electronically coupled to said supply voltage U1 via said first transistor T5 for a voltage signal greater than said threshold value indicative of a large signal amplitude at said coil.

6. Amplifier circuit according to claim 5 wherein the circuit network at the base of the first transistor is connected to the coil via a threshold value element.

\* \* \* \* \*